United States Patent
Letavic et al.

[11] Patent Number: 5,973,341
[45] Date of Patent: Oct. 26, 1999

[54] LATERAL THIN-FILM SILICON-ON-INSULATOR (SOI) JFET DEVICE

[75] Inventors: Theodore Letavic, Putnam Valley, N.Y.; Erik Peters; Rene Zingg, both of Nijmegen, Netherlands

[73] Assignee: Philips Electronics North America Corporation, New York, N.Y.

[21] Appl. No.: 09/211,149

[22] Filed: Dec. 14, 1998

[51] Int. Cl.⁶ .......................... H01L 29/80; H01L 31/112
[52] U.S. Cl. .......................... 257/287; 257/285; 257/488
[58] Field of Search .................... 257/256, 272, 257/285, 287, 488, 496

[56] References Cited

U.S. PATENT DOCUMENTS

| | | | |
|---|---|---|---|
| 5,130,770 | 7/1992 | Blanc et al. | 357/23 |
| 5,246,870 | 9/1993 | Merchant | 437/21 |
| 5,300,448 | 4/1994 | Merchant et al. | 437/41 |
| 5,412,241 | 5/1995 | Merchant | 257/409 |
| 5,420,457 | 5/1995 | Shibib | 257/488 |
| 5,432,377 | 7/1995 | Litwin | 257/506 |
| 5,889,298 | 3/1999 | Plumton et al. | 257/285 |

*Primary Examiner*—Ngân V. Ngô
*Attorney, Agent, or Firm*—Steven R. Biren

[57] ABSTRACT

A lateral thin-film Silicon-On-Insulator (SOI) JFET device includes a semiconductor substrate, a buried insulating on the substrate, and a JFET device in a thin semiconductor layer of a first conductivity type on the buried insulating layer. The device includes a source region of the first conductivity type, a control region of a second conductivity type which is laterally spaced apart from the source region and a lateral drift region of the first conductivity type adjacent to the control region. A drain region of the first conductivity type is provided laterally spaced apart from the control region in a first lateral direction by the lateral drift region, and at least one field plate electrode is provided over at least a major portion of the lateral drift region and is insulated from the drift region by an insulation region. The control region includes control region segments which are spaced apart in a second lateral direction perpendicular to the first lateral direction by portions of the thin semiconductor layer, thus providing a normally "on" JFET device.

6 Claims, 1 Drawing Sheet

LATERAL THIN-FILM SILICON-ON-INSULATOR (SOI) JFET DEVICE

BACKGROUND OF THE INVENTION

The invention is in the field of Semiconductor-On-Insulator (SOI) devices, and relates more particularly to SOI JFET devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of lateral thin-film SOI device includes a semiconductor substrate, a buried insulating layer on the substrate, and a lateral MOS device on the buried insulating layer, the MOS device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom by an insulation region, a lateral drift region of the first conductivity type, and a drain region of the first conductivity type laterally spaced apart from the channel region by the drift region.

A device of this type is shown in FIG. 1 common to related U.S. Pat. No. 5,246,870 (directed to a method) and U.S. Pat. No. 5,412,241 (directed to a device), commonly-assigned with the instant application and incorporated herein by reference. The device shown in FIG. 1 of the aforementioned patents is a lateral SOI MOSFET device having various features, such as a thinned SOI layer with a linear lateral doping profile in the drift region and an overlying field plate, to enhance operation. As is conventional, this device is an n-channel or NMOS transistor, with n-type source and drain regions, manufactured using a process conventionally referred to as NMOS technology. An SOI device with a linearly-doped drift region of constant thickness is shown in U.S. Pat. No. 5,300,448, also commonly-assigned with the instant application and incorporated herein by reference.

More advanced techniques for enhancing high-voltage and high-current performance parameters of SOI power devices are shown in U.S. patent application Ser. No. 08/998,048, filed Dec. 24, 1997, commonly-assigned with the instant application and incorporated herein by reference. Another technique for improving the performance of an SOI device is to form a hybrid device, which combines more than one type of device configuration into a single structure. Thus, for example, in U.S. patent application Ser. No. 09/122,407, filed Jul. 24, 1998, commonly-assigned with the instant application and incorporated herein by reference, an SOI device is disclosed which includes a lateral DMOS transistor and an LIGB transistor in the same structure.

Thus, it will be apparent that numerous techniques and approaches have been used in order to enhance the performance of MOS power semiconductor devices, in an ongoing effort to attain a more nearly optimum combination of such parameters as breakdown voltage, size, current-carrying capability and manufacturing ease. While all of the foregoing structures provide varying levels of improvement in device performance, no one device or structure fully optimizes all of the design requirements for high-voltage, high-current operation.

Although the references discussed above relate to MOS transistor devices, in some applications it would be desirable to have high-voltage SOI JFET device structures which exhibit similarly enhanced performance. Although SOI JFET devices presently exist, as shown for example in U.S. Pat. Nos. 5,130,770 and 5,432,377, these devices do not exhibit the type of superior high-voltage, high-current performance as exemplified by the SOI MOS devices discussed above.

Accordingly, it would be desirable to have an SOI JFET device structure, preferably of the normally "on" type, capable of high performance in a high-voltage, high-current environment, in which operating parameters, and in particular "on" resistance and breakdown voltage, are further optimized.

It would also be desirable to have an SOI JFET device structure which can be fabricated using a process technology very similar to that used to fabricate enhanced SOI MOSFET devices such as those discussed above.

SUMMARY OF THE INVENTION

It is therefore an object of the present invention to provide an SOI JFET device structure of the normally "on" type capable of high-performance in a high-voltage, high-current environment. It is a further object of the invention to provide such a transistor device structure in which operating parameters such as "on" resistance and breakdown voltage are enhanced. Yet a further object of the invention is to provide such a transistor device structure which can be fabricated using a process technology very similar to that used to fabricate SOI MOSFET devices with improved high-voltage and high-current capability.

In accordance with the invention, these objects are achieved in a lateral thin-film SOI JFET device structure of the type described above in which a buried insulating layer is provided on a semiconductor substrate, and the JFET device is provided in a thin semiconductor layer of a first conductivity type on the buried insulated layer and having a source region of the first conductivity type, a control region of a second conductivity type opposite to that of the first and laterally spaced apart from the source region, a lateral drift region of the first conductivity type adjacent the control region, and a drain region of the first conductivity type and laterally spaced apart from the control region in a first lateral direction by the lateral drift region. At least one field plate electrode is provided over at least a major portion of the lateral drift region, with the field plate electrode being insulated from the drift region by an insulation region, and the control region includes control region segments which are spaced apart in a second lateral direction perpendicular to the first lateral direction by portions of the thin semiconductor layer.

In a preferred embodiment of the invention, the lateral drift region may have a linearly graded doping profile, and either one or two field plate electrodes may be provided over the lateral drift region.

In a further preferred embodiment of the invention, the field plate electrode may be connected to the control region of the second conductivity type.

Lateral thin-film SOI JFET devices in accordance with the present invention offer a significant improvement in that a combination of favorable performance characteristics making the devices suitable for operation in a high-voltage, high-current environment, such as low "on" resistance and high breakdown voltage, can be achieved in a normally "on" JFET device which can be fabricated using a process technology very similar to that used to fabricate enhanced SOI MOSFET devices.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
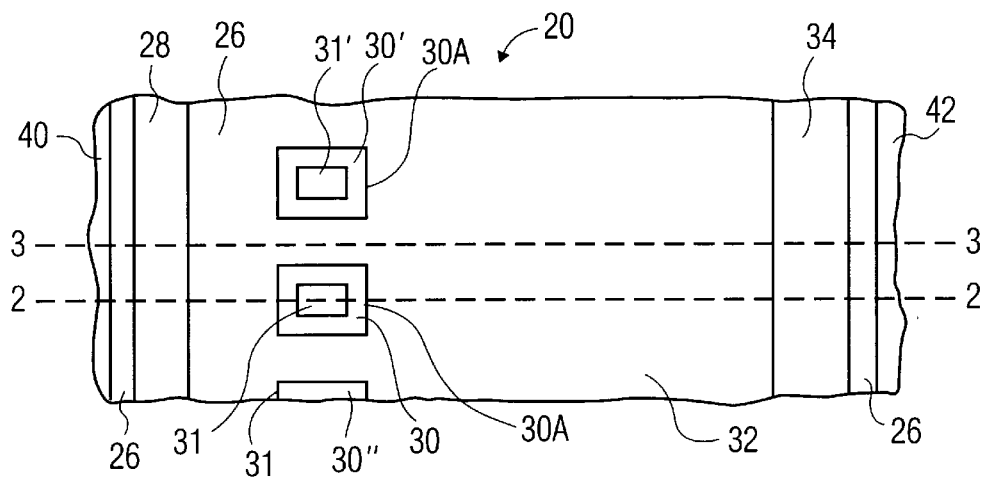
FIG. 1 shows a simplified plan view of a lateral thin-film SOI JFET device in accordance with a preferred embodiment of the invention.

In the drawing, semiconductor regions having the same conductivity type are generally shown hatched in the same direction in the cross-sectional views, and it should be understood that the figures are not drawn to scale.

DESCRIPTION OF THE PREFERRED EMBODIMENTS

Figure 2:
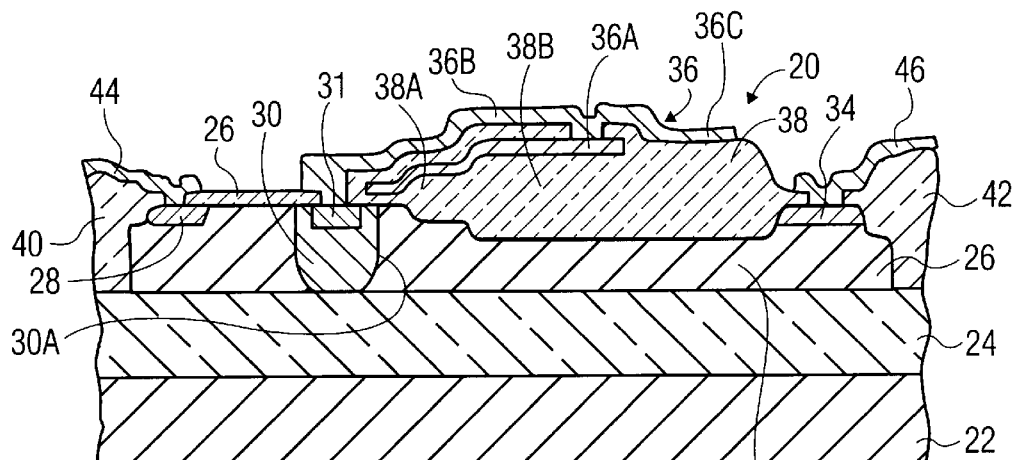
FIG. 2 shows a simplified cross-sectional view of the lateral thin-film SOI JFET device of FIG. 1 taken along the line 2—2 in FIG. 1.

In the simplified cross-sectional view of FIG. 2, taken along the line 2—2 in FIG. 1, a lateral thin-film SOI JFET transistor 20 includes a semiconductor substrate 22, a buried insulating layer 24, and a semiconductor surface layer 26 of a first conductivity type in which the device is fabricated. The JFET transistor includes a source region 28 of the first conductivity type, a control region 30 of a second, opposite conductivity type having a more highly doped control contact region 31 of the second conductivity type, a lateral drift region 32 of the first conductivity type adjoining an edge 30A of the control region 30, and a drain region 34, also of the first conductivity type. A field plate electrode structure, generally designated by reference numeral 36 and described in further detail hereinafter, is provided over the structure and is insulated from the underlying semiconductor surface layer 26 by an oxide insulation region 38.

The field plate electrode structure 36 may either be composed of a polysilicon portion 36A which extends over a portion of the drift region 32 and which is connected to a metallization layer 36B which connects the polysilicon field plate electrode portion 38A to the control contact region 31 and which also has an additional portion 36C which extends beyond 36A in the direction of drain region 34 and thereby forms a portion of the field plate electrode structure 36, which in its totality extends over a major portion of the lateral drift region 32. Alternatively, the polysilicon portion 36A can extend further to the right, and the overlying metallization 36B can terminate just past the point where it makes contact with 36A, thus eliminating the portion 36C in FIG. 2, in which case only one field plate electrode (36A) is employed.

The device shown in the figures is self-terminating, in that insulation regions 40 and 42, typically of silicon dioxide, are provided on either side of the device 20 and serve to insulate the device in the lateral direction from adjacent conductive structures. Finally, contact to the source and drain regions (28, 34) is provided by conventional metallization layers 44 and 46, respectively.

Figure 3:
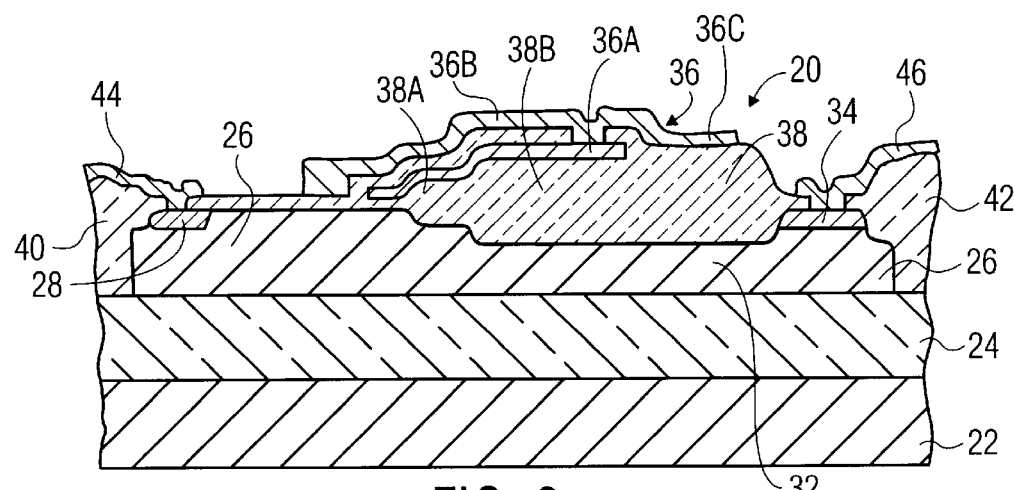
FIG. 3 shows a simplified cross-sectional view taken along the line 3—3 in FIG. 1.

FIG. 3 shows a simplified cross-sectional view of the device 20 taken along the line 3—3 in FIG. 1. Since most portions of the device shown in FIG. 3 are identical to the corresponding portions of the device as show in FIG. 2, these portions will not be described in further detail. FIG. 3 differs from FIG. 2 primarily in that this cross-sectional view is taken through a portion of the device 20 that does not contain the control region 30 or control contact region 31 of FIG. 2, so that a continuous conductive path of the first conductivity type (typically n type) is formed from source region 28 through the semiconductor layer 26 and the drift region 32 to drain region 34. In this manner, the JFET device 20 operates as a normally "on" device in the absence of any external bias.

Within the scope of the invention, the SOI JFET transistor structure used in the present invention may have various performance-enhancing features, either alone or in combination, such as a stepped oxide region 38A, 38B, a thinned lateral drift region portion 32, and a linearly graded doping profile in the drift region 32, all as detailed in the aforementioned prior art, or other performance-enhancing features as desired, without departing from the spirit or scope of the invention. Alternatively, a lateral drift region of constant thickness, such as that shown in U.S. Pat. No. 5,300,448, may be employed.

It will be understood that the simplified, representative devices shown in the Figures depict particular device structures, but that wide variations in both device geometry and configuration can be used within the scope of the invention. Doping levels and dimensions are conventional and may vary from the representative values detailed in the aforementioned prior art.

The simplified representative plan view of FIG. 1 shows a top view of major elements the lateral SOI JFET device in a manner which more clearly illustrates the interrelationship between the cross-sectional views of FIGS. 2 and 3. Since all of the structural elements of FIG. 1 have previously been described, in connection with the description of FIGS. 2 and 3, FIG. 1 will be used to illustrate the interrelationship between the structural elements of FIGS. 2 and 3 without further description of these elements. In the simplified plan view of FIG. 1, semiconductor surface layer 26 includes source region 28 at its left side and drain region 34 at its right side, with lateral drift region 32 extending toward the drain region at the right side of the device. The control region 30 can be seen to comprise a plurality of control region segments 30, 30', 30'', etc. which are spaced apart in the vertical direction in FIG. 1, and each of the control region segments is provided with a corresponding control contact region 31, 31', etc. therewithin. Since the control region segments are spaced apart in the vertical direction in FIG. 1, portions of the device, such as the portion along the line 3—3, are composed entirely of same-conductivity-type material, and are thus conductive in the zero-bias state. Other portions of the device, such as the portion through the line 2—2 in FIG. 1, contain a control region segment 30 of opposite conductivity type, and are thus nonconductive in the zero-bias state. By applying suitable voltages to the control region segments, as well as the field plate electrode(s) and remaining structure, the normally "on" device 20 can be effectively switched "off", in a manner that will be described in further detail below. It should be understood that although only 3 control region segments are shown in FIG. 1, the invention is not limited to this number of segments.

The normally "on" SOI JFET devices of the present invention can be turned "off" using mixed-mode coupled depletion regions to pinch off the conduction path from source 28 to drain 34 in the normally "on" structure. In structures in accordance with the present invention, lateral depletion by pinch-off of the regions between the spaced-apart control region segments 30 is combined with vertical depletion from MOS capacitors to achieve a device having pinch-off characteristics which are a function of device layout. Thus, as seen in FIG. 1, lateral depletion is achieved by appropriately biasing the p-n junctions formed between the semiconductor surface layer 26 of the first conductivity type and the control region segments 30 of the second conductivity type. Additionally, vertical depletion is obtained from MOS capacitors formed between the field plate structure 36, insulation region 38 and semiconductor surface layer 26, and between semiconductor surface layer 26, buried insulating layer 24 and semiconductor substrate 22. The vertical depletion region formed by the MOS capacitors will be adjacent to (and in FIG. 2 to the right of) the lateral depletion regions formed by the aforementioned p-n junctions between the control region segments and the thin semiconductor layer, and these various depletion regions can interact to completely pinch off the device. Significantly, lateral pinch-off will be a function of the geometry and spacing of the control region segments 30, while vertical pinch-off is a function of the doping level in semiconductor layer 26 and the thickness of insulating layers 38 and 24, thus providing a mixed depletion mode in which both junction field effect behavior and MOS field effect behavior are combined to effectively pinch off the normally "on" device. Furthermore, the present invention offers the significant advantage that pinch-off characteristics can be established as a function of controllable parameters such as device geometry and doping level, for improved control of device operating parameters and enhanced ease of manufacture.

Finally, it will be recognized that the devices in accordance with the present invention may be fabricated using known prior-art techniques, such as those described in the aforementioned prior art, including but not limited to implantation and/or diffusion techniques for forming the control region segments 30 and more highly doped control contact regions 31 as shown in FIGS. 1 and 2, and that wide variations in device geometry, dimensions, doping level and configuration can be used within the scope of the invention, as will be apparent to those of ordinary skill in the art.

While the invention has been particularly shown and described with reference to several preferred embodiments thereof, it will be understood by those skilled in the art that various changes in form and detail may be made without departing from the spirit or scope of the invention.

What is claimed is:

1. A lateral thin-film Silicon-On-Insulator (SOI) JFET device comprising a semiconductor substrate, a buried insulating layer on said substrate, and a JFET device in a thin semiconductor layer of a first conductivity type on said buried insulating layer and having a source region of said first conductivity type, a control region of a second conductivity type opposite to that of the first and laterally spaced apart from said source region, a lateral drift region of said first conductivity type adjacent said control region, a drain region of said first conductivity type and laterally spaced apart from said control region in a first lateral direction by said lateral drift region, and at least one field plate electrode over at least a major portion of said lateral drift region, said field plate electrode being insulated from said drift region by an insulation region, and said control region comprising control region segments which are spaced apart in a second lateral direction perpendicular to said first lateral direction by portions of said thin semiconductor layer.

2. A lateral thin-film Silicon-On-Insulator (SOI) JFET device as in claim 1, wherein said lateral drift region has a linearly graded doping profile.

3. A lateral thin-film Silicon-On-Insulator (SOI) JFET device as in claim 1, wherein only one field plate electrode is provided over said lateral drift region.

4. A lateral thin-film Silicon-On-Insulator (SOI) JFET device as in claim 1, wherein two field plate electrodes are provided over said lateral drift region.

5. A lateral thin-film Silicon-On-Insulator (SOI) JFET device as in claim 1, wherein said at least one field plate electrode is connected to said control region.

6. A lateral thin-film Silicon-On-Insulator (SOI) JFET device as in claim 5, wherein said at least one field plate electrode is connected to said control region by a control contact region.

* * * * *